United States Patent
Bregante et al.

(10) Patent No.: US 6,511,866 B1
(45) Date of Patent: Jan. 28, 2003

(54) USE OF DIVERSE MATERIALS IN AIR-CAVITY PACKAGING OF ELECTRONIC DEVICES

(75) Inventors: Raymond S. Bregante, San Rafael, CA (US); Tony Shaffer, Alameda, CA (US); K. Scott Mellen, Central Square, NY (US); Richard J. Ross, Moraga, CA (US)

(73) Assignee: RJR Polymers, Inc., Oakland, CA (US)

( * ) Notice: Subject to any disclaimer, the term of this patent is extended or adjusted under 35 U.S.C. 154(b) by 0 days.

(21) Appl. No.: 09/904,583

(22) Filed: Jul. 12, 2001

(51) Int. Cl.$^7$ .......................... H01L 21/44; H01L 21/30
(52) U.S. Cl. ...................... 438/127; 438/106; 438/118; 438/121; 438/456
(58) Field of Search ................................. 438/106, 456, 438/116, 122, 127, 107, 110, 112, 118, 121, 124, 125, 126, 455

(56) References Cited

U.S. PATENT DOCUMENTS

| | | | | |
|---|---|---|---|---|
| 4,398,342 A | * | 8/1983 | Pitt et al. ........................ 29/580 |
| 4,594,770 A | * | 6/1986 | Butt .............................. 29/588 |
| 4,831,212 A | * | 5/1989 | Ogata et al. ................. 174/52.4 |
| 5,070,041 A | * | 12/1991 | Katayama et al. ........... 437/214 |
| 5,407,502 A | * | 4/1995 | Takenaka et al. .............. 156/89 |
| 5,598,034 A | * | 1/1997 | Wakefield ................... 257/706 |
| 5,773,377 A | | 6/1998 | Harris et al. |
| 5,787,578 A | | 8/1998 | Farooq et al. |
| 5,837,935 A | * | 11/1998 | Carper et al. ............... 174/52.4 |
| 5,869,883 A | | 2/1999 | Mehringer et al. |
| 5,893,726 A | * | 4/1999 | Farnworth et al. .......... 438/108 |
| 5,911,112 A | * | 6/1999 | Kirkman ..................... 438/612 |
| 6,037,193 A | * | 3/2000 | Interrante et al. ........... 438/122 |
| 6,117,705 A | * | 9/2000 | Glenn et al. ................. 438/106 |
| 6,204,454 B1 | * | 3/2001 | Gotoh et al. ................. 174/255 |
| 6,265,246 B1 | * | 7/2001 | Ruby et al. .................. 438/113 |
| 6,291,263 B1 | * | 9/2001 | Huang ........................ 438/106 |
| 6,297,072 B1 | * | 10/2001 | Tilmans et al. ............. 438/106 |
| 6,303,986 B1 | * | 10/2001 | Shook ........................ 257/680 |
| 6,323,550 B1 | * | 11/2001 | Martin et al. ............... 257/704 |
| 6,384,353 B1 | * | 5/2002 | Huang et al. ............... 200/181 |
| 6,384,473 B1 | * | 5/2002 | Peterson et al. ............ 257/680 |

OTHER PUBLICATIONS

D.R. Frear, "Materials Issues in Area–Array Microelectronic Packaging," *JOM* (1999) 51(Mar. 1999): 22–27.

* cited by examiner

Primary Examiner—Michael Sherry
Assistant Examiner—Scott B. Geyer
(74) Attorney, Agent, or Firm—Townsend and Townsend and Crew, LLP

(57) ABSTRACT

Semiconductor circuit devices (dies) are incorporated into moisture-impenetrable electronic packages by forming enclosures around the die in three separate parts—base, sidewalls, and lid. The die is first soldered or otherwise bonded to the base, followed by attachment of the sidewalls to the base, and finally the lid to the sidewalls. For procedures involving a heat-conductive base and a high soldering temperature, the die can be secured to the base at the high soldering temperature, followed by application of the sidewalls to the base at a significantly lower temperature, avoiding potential high-temperature damage to the sidewalls. Plastic sidewalls which would otherwise deteriorate or become distorted upon exposure to the high soldering temperature can thus be used. For electronic packages in general, the use of plastic sidewalls allows the use of combinations of materials for the lid and base that are otherwise incompatible, and reduces or eliminates the incidence of failure due to stress fractures that occur during the high temperatures encountered in fabrication, assembly, testing, or use of the package.

25 Claims, No Drawings

USE OF DIVERSE MATERIALS IN AIR-CAVITY PACKAGING OF ELECTRONIC DEVICES

This invention arises in the field of electronic packages that encase and protect semiconductor circuit devices (dies) and provide the electrical connections that join the die circuitry to external components such as those of a printed circuit board. This invention is particularly concerned with air-cavity packages, i.e., those in which the die resides in an air-filled cavity where the performance of the die benefits from the low dielectric constant of air. In particular, this invention addresses the difficulty of sealing the package around the die and the air-filled cavity in a manner that will maintain a gas-impermeable seal during the high temperatures encountered during the fabrication of the package and the conditions encountered by the package in use.

BACKGROUND OF THE INVENTION

An electronic package consists of a die sealed inside a protective enclosure whose walls are penetrated by leads by which the die circuitry is electrically connected to external circuitry such as that on a printed wiring board. The packages of interest in this invention are those that are known in the electronics industry as "air-cavity packages" since the die resides in a hollow internal air-filled cavity inside the enclosure, the air serving as an electrical insulator due to its low dielectric constant. This insulating ability is particularly useful when the electronic device is a microwave power chip. The air-filled cavity is also useful when the die is one that requires light transmission, such as CCDs and CMOS devices, since the air provides full optical access to the surface of the die.

To achieve consistent and reliable performance with the extremely fine circuit lines and high current densities that are currently used in dies, the package must be sealed against the intrusion of water vapor and other atmospheric gases. At the same time, the package must be capable of dissipating the heat that the die generates during use. Heat dissipation is commonly achieved through the floor of the package, and for this reason a heat conductive material, generally a metal plate, is used as the floor, with a high-temperature heat-conductive solder, often a eutectic solder, joining the die to the floor. Packages are generally formed by first bonding sidewalls to the metallic plate to form the body of the package, the sidewalls having electric leads passing through them. Once the body is formed, the die is placed inside the body and secured to the floor with the solder. Wire bonding is then done to join the die circuitry to the leads, and the package is finally completed by securing the lid to the body with an appropriate adhesive to close off the top.

The high soldering temperature needed to secure the die to the floor of the package requires that the body of the package be constructed of a material that can withstand the high temperature without cracking, melting, flowing, decomposing or otherwise undergoing transformations that might compromise the seals throughout the package. Packages intended for high-wattage use impose an additional strain on the package walls and lid because of the high temperatures that they generate during use. For these reasons, package sidewalls and lids of the prior art are made of ceramic material. Ceramics are costly, however, and with mass production of the packages, the ceramic is a major component of the manufacturing cost of the package. Cost could be reduced considerably if the ceramic were be replaced by plastic materials, but plastics do not readily withstand the high soldering temperatures and will either melt or decompose when the die is soldered to the base. As a result, the manufacture of electronic packages with plastic sidewalls has a high failure rate.

A similar problem arises in packages that are fabricated as two-piece enclosures, in which the base and side walls are initially formed as a single molded piece of ceramic or plastic with a metallic heat spreader molded or otherwise inserted as the floor, the second piece being the lid. If ceramic is used as the material of construction for the unitary base and sidewalls, the cost is high, and if plastic is used, the product yield in mass production will be low due to deterioration or distortion of the plastic and the formation of leakage sites in a significant portion of the units.

A separate problem is presented by optical packages, i.e., those containing CCDs or CMOS devices that require transparent lids to allow transmission of light. Since these packages do not generate heat in use, they do not require a rapidly heat-dispersing metal base; metal, plastic, or ceramic bases can be used. In addition, the lack of a need for fast heat dissipation eliminates the need for high-temperature metallic soldering allows. Instead, low-temperature soldering can be done using soldering materials such as epoxy. The response to high temperatures is nevertheless a concern, since before the package can be used, it is subjected to further processing subsequent to the assembly of the package itself. This subsequent processing includes soldering of the leads outside the package to external circuitry as well as qualification tests, all of which may involve the use of high temperatures. During exposure to these temperatures, differences in the coefficients of thermal expansion (CTEs) of the package components render the package vulnerable to breakage. In particular, the glass lid that is used on the typical optical package to permit light transmission has a significantly lower CTE than the base, whether the base is metallic, plastic or ceramic. This difference causes the lid and base to expand to different degrees during thermal cycling. Differential expansion causes the package to bow and places the side walls under stress, raising the risk of compromising the seals that bond the sidewalls either to the base or to the lid, or both. When fissures form, the packages will fail the gross leak tests and moisture sensitivity tests that determine whether they are suitable for use, and the yield of useful product (functioning, long-life packages) drops.

SUMMARY OF THE INVENTION

The difficulties enumerated above and others that are encountered in the fabrication of air-cavity electronic packages are addressed in accordance with this invention by utilizing at least three initially separate components—a base, a sidewall frame, and a lid—to form the enclosure. For packages that generate a high degree of heat during use and are fabricated with a high temperature solder joining the die to the base, the three component construction of the package enclosure permits the die to be soldered to the base before any of the other components of the enclosure are assembled, i.e., before either the sidewalls are bonded to the base or the lid to the sidewalls. Plastic sidewalls can then be bonded to the base with no risk of exposing the plastic to the high temperatures needed for soldering the die to the base. Also, the high cost of ceramics can be eliminated or reduced either by avoiding ceramics entirely or using ceramics only for the base. For vision packages with transparent lids, the three-component construction of the package enclosure permits the use of plastic sidewalls with a non-plastic base and a non-plastic lid. The base and lid can then be formed of materials whose CTEs are close in value while the sidewall is formed of a material with a CTE that differs substantially from those of both the base and lid. The use of plastics having a relatively high CTE as the sidewalls will not place undue stress on the package seals since even though the sidewalls may thicken (i.e., bulge both inwardly and outwardly) at the high temperatures encountered in assembly processing and testing, the base and lid will expand substantially equally, thereby preventing the package from bowing.

This invention thus offers various advantages, depending on the type of package and the materials used. In general, the invention permits wide latitude in the choice of materials while avoiding or reducing the risk of package failure due to fissures resulting from the high temperatures encountered during assembly and use. These and other advantages, features, and embodiments of the invention will be more apparent from the description that follows.

DETAILED DESCRIPTION OF THE INVENTION AND PREFERRED EMBODIMENTS

As noted above, the first step in the fabrication process of this invention is the securement of the die to a base plate that will serve as the floor of the package. Depending on the type of package, the base plate may be one that dissipates heat rapidly from the die, or one in which heat dissipation is not critical (such as for optical packages). When high heat conductivity is needed, the plate can be either a metallic material, a ceramic material, a metal-coated ceramic material, or a ceramic material with a metal insert. When high heat conductivity is not needed, the plate can be any of these materials as well as plastic.

For base plates of metal or metal inserts or coatings, examples of suitable metals are listed below, together with their symbols as indicated by the *Electronic Materials Handbook*, Vol. 1, Minges, M. L., et al, eds., ASM International, Materials Park, Ohio, 1989:

- copper
- copper-tungsten alloys
- copper-iron alloys: C19400, C19500, C19700, C19210
- copper-chromium alloys: CCZ, EFTEC647
- copper-nickel-silicon alloys: C7025, KLF 125, C19010
- copper-tin alloys: C50715, C50710
- copper-zirconium alloys: C15100
- copper-magnesium alloys: C15500
- iron-nickel alloys: ASTM F30 (Alloy 42)
- iron-nickel-cobalt alloys: ASTM F15 (Kovar)
- mild steel
- aluminum Preferred among these are copper, copper-containing alloys in which copper constitutes at least 95% by weight, iron-nickel alloys in which iron constitutes from about 50% to about 75% by weight, and iron-nickel-cobalt alloys in which iron constitutes from about 50% to about 75% by weight. The iron-nickel alloy Alloy 42 (58% Fe, 42% Ni) and the iron-nickel-cobalt alloy Kovar (54% Fe, 29% Ni, 17% Co), as well as the various copper alloys are of particular interest. Metal laminates can also be used, notably copper-molybdenum-copper in view of its particular high thermal conductivity. These metals and alloys can also be used as the leads penetrating the sidewalls of the package.

For packages using a ceramic base, examples of suitable ceramics are $Al_2O_3$ (alumina), BeO (beryllia), AlN (aluminum nitride), SiN (silicon nitride), and blends of these materials, and $Al_2O_3$ modified by the addition of BaO (barium oxide), $SiO_2$ (silica), or CuO (cupric oxide). Preferred ceramics are alumina, optionally modified, and beryllia.

For packages using a plastic base, suitable plastics include both thermosetting and thermoplastic materials. Examples of thermosetting materials are epoxy resins and modified epoxy resins, polyimides, modified polyimides, polyesters, and silicones. Examples of thermoplastic materials are polyurethanes, polyphenylene sulfide, polysulfone, polyether ketone, and aromatic polyesters such as liquid crystal polymer containing approximately 20–40% filler such as glass, ceramic or minerals.

When a highly heat-transmissive bond is needed between the die and the base, a wide variety of solder materials are available that will form such a bond. Solder alloys may be formed from tin, lead, antimony, bismuth, cadmium, silver, copper, or gold, and various other elements in relatively small amounts. Eutectic alloys are generally preferred because of their ability to maintain the proportions of their components during melting and solidification. Examples are copper-iron alloys, copper-chromium alloys, copper-tin alloys, iron-nickel alloys, iron-nickel-cobalt alloys, tin-silver alloys, and gold-tin alloys. An 80:20 gold-tin eutectic solder is particularly preferred due to its high thermal conductivity.

The temperature at which the die is soldered or bonded to the base will vary depending on the solder or bonding agent used. For high-temperature soldering as needed for high heat transmissivity, a soldering temperature above 250° C. is generally used. In most cases, the soldering temperature will fall within the range of 250° C. to 500° C., and preferably, particularly with a gold-tin eutectic solder, within the range of 300° C. to 400° C. For low-temperature soldering or bonding, the temperature will generally fall within the range of 125° C. to 175° C. When epoxy is used, for example, the typical bonding temperature is about 150° C.

After the die is soldered or bonded to the base and cooled, the sidewalls are applied as a frame over the base. Either thermosetting or thermoplastic materials, examples of which are listed above, can be used for the sidewalls. Thermosetting materials are typically molded by transfer molding, while thermoplastic materials are typically molded by injection molding, although different molding methods can be used for each. The sidewalls can be preformed with embedded leads, the leads having surfaces or ends that extend into the space enclosed by the sidewalls and thus accessible for wire bonding to the die. For non-metallic bases, the leads can also be embedded in the base. In either case, the leads can be formed of the same types of materials as those used for metallic bases, and examples are listed above. If the leads are part of the base, the sidewalls may be made entirely of plastic and the need for moisture-proof sealing at this stage of the fabrication procedure exists only at the interface between the sidewalls and the base.

In packages in which the leads are embedded in the sidewalls, the sidewall frame can be molded over the leads. Procedures for molding sidewalls over leads are well known, and generally involve molding the plastic over a lead frame assembly that includes a series of metal leads joined by connecting webs and arranged in discrete groups, adjacent groups being connected by further connecting webs that will eventually be removed when molding is complete. Dams are included at certain locations along the leads to help confine the molding compound, the dams likewise being removed before the molded sidewall bodies are separated. Conventional molding techniques such as injection molding, transfer molding, insert molding, and reaction-injection molding can be employed, depending on the materials used. Prior to the molding process, adhesive is applied to the lead frame at the locations where the leads will contact the plastic. The adhesive will cure at the plastic molding temperature, forming a seal around the leads that will prevent intrusion of moisture and other atmospheric gases. The number of leads may vary widely depending on the die and the application for which it is intended. Thus, as few as two leads or as many as 100 or more may be present, and the leads may be on one side of the frame or on all four.

Application of the sidewall frame to the base is likewise achieved by the use of an adhesive, notably a heat-curable polymeric adhesive. Adhesives for use in both locations include both thermosetting and thermoplastic materials, such as epoxy adhesives, polyamides, silicones, phenolic resins, polysulfones, or phenoxy adhesives. Examples of thermosetting adhesives are:

D.E.R. 332: an epoxy resin with bisphenol A (Dow Chemical Company, Midland, Mich., USA)

ARALDITEC® ECN 1273: an epoxy cresol novolac (Ciba-Geigy Corporation, Ardsley, N.Y., USA)

ARALDITE® MY 721: a polyfunctional liquid epoxy resin (Ciba-Geigy Corporation)

QUARTEX® 1410: an epoxy resin with bisphenol A (Dow Chemical Company)

EPON® 828, 1001F, 58005: modified bisphenol A epoxy resins (Shell Chemical Company, Houston, Tex., USA)

Examples of Thermoplastic Adhesives are:

Phenoxy PKHJ: a phenoxy resin (Phenoxy Associates)

Polysulfones

The adhesive composition optionally includes one or more ingredients to provide the composition with any of a variety of desirable properties. These ingredients include curing agents, antifoaming agents, moisture getters (dessicants), and fillers to add bulk. Examples of curing agents are polyamines, polyamides, polyphenols, polymeric thiols, polycarboxylic acids, anhydrides, dicyandiamide, cyanoguanidine, imidazoles, and Lewis acids such as complexes of boron trifluoride with amines or ethers. Examples of antifoaming agents are hydrophobic silicas such as silicone resins and silanes, fluorocarbons such as polytetrafluoroethylene, fatty acid amides such as ethylene diamine stearamide, sulfonamides, hydrocarbon waxes, and solid fatty acids and esters. Examples of moisture getters are activated alumina and activated carbon. Specific products that serve as moisture getters are those identified by the supplier (Alpha Metals of Jersey City, N.J., USA) as GA2000-2, SD1000, and SD800. Examples of fillers are alumina, titanium dioxide, carbon black, calcium carbonate, kaolin clay, mica, silicas, talc, and wood flour.

In preferred bonding methods of the base, the lid, or both, the adhesive is first applied to the surface to be bonded, then heated to a moderate temperature to bring the adhesive to a B-stage in which the adhesive is tack-free and semi-solid at room temperature. The parts to be bonded, one or both of which having thus been coated with the B-stage adhesive, are then joined and heated further to cause the B-stage adhesive to liquefy and wet the surfaces and to cure fully to form a gas-impermeable seal.

The temperature used in curing the adhesive joining the sidewall frame to the base will vary with the particular adhesive used, but will generally be below 200° C. In most cases, the temperature range will be from 100°C. to 200° C., and preferably from 125° C. to 185° C.

Once the sidewall frame is bonded to the base, the die is wire bonded to the leads, and a lid is affixed to the sidewall frame to enclose the die. Securement of the lid to the sidewall frame can be accomplished by adhesives in the same manner as the securement of the sidewall frame to the base.

A parameter of the materials used as the base and the lid, the plastic used in the sidewall frame, the metal used in the leads, and the adhesive used in bonding the leads to the sidewall frame, the sidewall frame to the base, and the lid to the sidewall frame is the coefficient of thermal expansion ("CTE"). Each material has its own CTE, which is expressed in units of parts per million (by weight) per degrees Celsius, and the CTEs will influence the choice of materials used. The CTEs of any two adjacent components and of any adhesive and the component(s) that it is joining together may differ significantly. Differences can be compensated for in many cases by including a thermoplastic component in the adhesive composition, either as the sole adhesive ingredient or as a mixture with a thermosetting adhesive ingredient.

The process of this invention affords a high degree of versatility to the materials used in electronic package manufacture. For example, a 0.4-inch square package mid-body (i.e., sidewall frame) with eight leads on each side can be used in a power package in which the base is metal and the lid is ceramic. The same mid-body can be used in a CCD or CMOS vision package in which the base is ceramic and the lid is clear glass. The same mid-body can also be used with a metal base and a metal lid to shield the die from RF or electromagnetic radiation. The invention also allows one to accommodate otherwise incompatible materials for the package components. For example, the glass used as the lid in a typical vision package has a CTE of approximately 7 ppm/deg C, while the base, particularly when the package is to be applied to a printed circuit board, has a CTE within the range of 15 to 25 ppm/deg C. The difference can be mitigated by using a mid-body made of a plastic with a CTE of intermediate value, such as an average of the CTEs of the base and lid, plus or minus 30%. This will reduce the tendency of the package to bow in the direction of the low CTE glass lid or in extreme cases to cause the lid to crack or to create leaks at the bond lines, either during fabrication of the package or during the temperature cycles encountered during post-fabrication assembly and testing procedures.

All of the package fabrication steps can be performed in an array format in which multiple units are processed simultaneously in a two-dimensional array. With appropriately positioned location holes, the two-dimensional arrays of adjacent components can be accurately aligned for simultaneous assembly. Alternatively, any of the components can be fabricated and bonded individually.

The foregoing description emphasizes particular embodiments and examples of the invention. As those skilled in the art will recognize, however, the invention extends as well to variations and modifications of the above, in terms of materials, operating conditions, operating procedures, and other parameters of the construction of these packages and of procedures for their assembly.

What is claimed is:

1. A process for encasing a semiconductor circuit device to form a sealed air-cavity package, said process comprising:

(a) soldering said semiconductor circuit device to a heat-conductive base at a temperature in excess of 250° C.;

(b) affixing a plastic frame of sidewalls over said heat-conductive base after the completion of step (a) by forming a seal between said side walls and said heat-conductive base at a temperature lower than 200° C., thereby forming a partial enclosure around said semiconductor circuit device, said plastic frame or said heat-conductive base having been preformed with electrically conductive leads such that said leads penetrate said partial enclosure;

(c) electrically connecting the circuit of said semiconductor circuit device to said leads; and (d) affixing a lid to said partial enclosure thereby encasing said semiconductor circuit device in a housing that is substantially impermeable to gases.

2. A process in accordance with claim 1 in which said temperature of step (a) is within the range of 250° C. to 500° C.

3. A process in accordance with claim 1 in which said temperature of step (a) is within the range of 300° C. to 400° C.

4. A process in accordance with claim 1 in which said temperature of step (b) is within the range of 100° C. to 200° C.

5. A process in accordance with claim 1 in which said temperature of step (b) is within the range of 125° C. to 185° C.

6. A process in accordance with claim 1 in which said heat-conductive base is a metal base.

7. A process in accordance with claim 6 in which said metal base is a member selected from the group consisting of copper, alloys of copper in which copper is the major component, iron-nickel alloys, and iron-nickel-cobalt alloys.

8. A process in accordance with claim 1 in which said heat-conductive base is a metal base and said lid is of plastic material.

9. A process in accordance with claim 1 in which said heat-conductive base is a base of a member selected from the group consisting of ceramic material, and metal-coated ceramic material.

10. A process in accordance with claim 9 in which said ceramic material is a member selected from the group consisting of $Al_2O_3$, BeO, AlN, SiN, and $Al_2O_3$ modified with a member selected from the group consisting of BaO, $SiO_2$, and CuO.

11. A process in accordance with claim 9 in which said ceramic material is a member selected from the group consisting of $Al_2O_3$ and BeO.

12. A process in accordance with claim 1 in which said heat-conductive base is a base of ceramic material and said lid is glass.

13. A process in accordance with claim 1 in which said plastic frame is formed of a thermoplastic polymer.

14. A process in accordance with claim 13 in which said thermoplastic polymer is an aromatic polyester.

15. A process in accordance with claim 13 in which said thermoplastic polymer is a liquid crystal polymer.

16. A process in accordance with claim 1 in which said plastic frame and said lid are both formed of thermoplastic polymer.

17. A process in accordance with claim 1 in which step (b) comprises sealing said plastic frame to said base with a heat-curable polymeric adhesive.

18. A process in accordance with claim 17 in which said heat-curable polymeric adhesive is a member selected from the group consisting of epoxy adhesives, polyamides, silicones, phenolic resins, polysulfones, and phenoxy adhesives.

19. A process in accordance with claim 17 in which said heat-curable polymeric adhesive is an epoxy resin.

20. A process in accordance with claim 1 in which step (d) comprises sealing said lid to said plastic frame with a heat-curable polymeric adhesive.

21. A process in accordance with claim 1 in which steps (b) and (d) comprise sealing said plastic frame to said base and said lid to said plastic frame, respectively, with a heat-curable polymeric adhesive at a temperature within the range of 125° C. to 185° C.

22. A process for encasing an optical semiconductor circuit device to form a sealed air-cavity package, said process comprising:

(a) securing said semiconductor circuit device to a base with a heat-curable polymeric adhesive at a temperature in within the range of 125° C. to 175° C.;

(b) affixing a plastic frame of sidewalls over said base after the completion of step (a) by forming a seal between said side walls and said base at a temperature lower than 200° C., thereby forming a partial enclosure around said semiconductor circuit device, said plastic frame or said base having been preformed with electrically conductive leads such that said leads penetrate said partial enclosure;

(c) electrically connecting the circuit of said semiconductor circuit device to said leads; and (d) affixing a lid to said partial enclosure thereby encasing said semiconductor circuit device in a housing that is substantially impermeable to gases, said lid having a coefficient of thermal expansion that is less than 0.5 times the coefficient of thermal expansion of said base.

23. A process in accordance with claim 22 in which said heat-curable polymeric adhesive is a member selected from the group consisting of epoxy adhesives, polyamides, silicones, phenolic resins, polysulfones, and phenoxy adhesives.

24. A process in accordance with claim 22 in which said heat-curable polymeric adhesive is an epoxy adhesive.

25. A process in accordance with claim 22 in which said lid is glass and said base is of ceramic material.

* * * * *